United States Patent
Gu et al.

(10) Patent No.: US 7,919,794 B2
(45) Date of Patent: Apr. 5, 2011

(54) MEMORY CELL AND METHOD OF FORMING A MAGNETIC TUNNEL JUNCTION (MTJ) OF A MEMORY CELL

(75) Inventors: Shiqun Gu, San Diego, CA (US); Seung H. Kang, San Diego, CA (US); Matt Nowak, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/970,557

(22) Filed: Jan. 8, 2008

(65) Prior Publication Data

US 2009/0174015 A1 Jul. 9, 2009

(51) Int. Cl.
*H01L 29/82* (2006.01)
(52) U.S. Cl. ............... 257/241; 257/295; 257/E21.001; 438/3
(58) Field of Classification Search ............ 257/68–71, 257/296–309, 905–908, E27.084–E27.097, 257/E27.075
See application file for complete search history.

(56) References Cited

U.S. PATENT DOCUMENTS

| 6,667,526 | B2 | 12/2003 | Komori |
| 6,841,820 | B2 | 1/2005 | Komuro et al. |
| 2006/0092690 | A1* | 5/2006 | Kim et al. ............ 365/158 |
| 2007/0228501 | A1* | 10/2007 | Nakamura et al. ........ 257/421 |
| 2007/0246787 | A1* | 10/2007 | Wang et al. ............ 257/421 |

OTHER PUBLICATIONS

International Search Report—PCT/US09/030451, International Search Authority—European Patent Office—Jun. 5, 2009.
Written Opinion—PCT/US09/030451, International Search Authority—European Patent Office—Jun. 5, 2009.

* cited by examiner

*Primary Examiner* — N Drew Richards
*Assistant Examiner* — Mamadou Diallo
(74) *Attorney, Agent, or Firm* — Sam Talpalatsky; Nicholas J. Pauley; Jonathan T. Velasco (57) ABSTRACT

A memory including a memory cell and method for producing the memory cell are disclosed. The memory includes a substrate in a first plane. A first metal connection extending in a second plane is provided. The second plane is substantially perpendicular to the first plane. A magnetic tunnel junction (MTJ) is provided having a first layer coupled to the metal connection such that the first layer of the MTJ is oriented along the second plane.

22 Claims, 11 Drawing Sheets

PRIOR ART

MEMORY CELL AND METHOD OF FORMING A MAGNETIC TUNNEL JUNCTION (MTJ) OF A MEMORY CELL

FIELD OF DISCLOSURE

The present disclosure relates generally to a memory cell and more specifically to a magnetic tunnel junction stack of a memory cell.

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory.

In contrast to conventional RAM technologies which store data as electric charges or current flows, Magnetoresistive Random Access Memory (MRAM) uses magnetic elements integrated with a complementary metal-oxide semiconductor (CMOS). In general, attributes of MRAM technology include nonvolatility and an unlimited read and write endurance. MRAM provides the potential for high speed, lower operating voltage and high density solid state memory. MRAM applications may include memory cells for automotive, mobile phone, smart card, radiation hardened military applications, database storage, Radio Frequency Identification Device (RFID) and MRAM elements in field-programmable gate array (FPGA). These potential MRAM applications can include both stand alone and embedded memory applications. In general, the bit architecture is based on a minimum size active transistor which serves as an isolation device in conjunction with a magnetic tunnel junction (MTJ) element or stack so as to define the MRAM bit.

As set forth above, MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Spin Transfer Torque (STT) writing technology is a technology where data can be written by aligning the spin direction of the electrons floating through a tunneling magnetoresistance (TMR) element. In general, data writing is performed by using a spin-polarized current with the electrons having the same spin direction. Spin torque transfer RAM generally has an advantage of requiring lower power and may provide better scalability over conventional MRAM. Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

Figure 1:
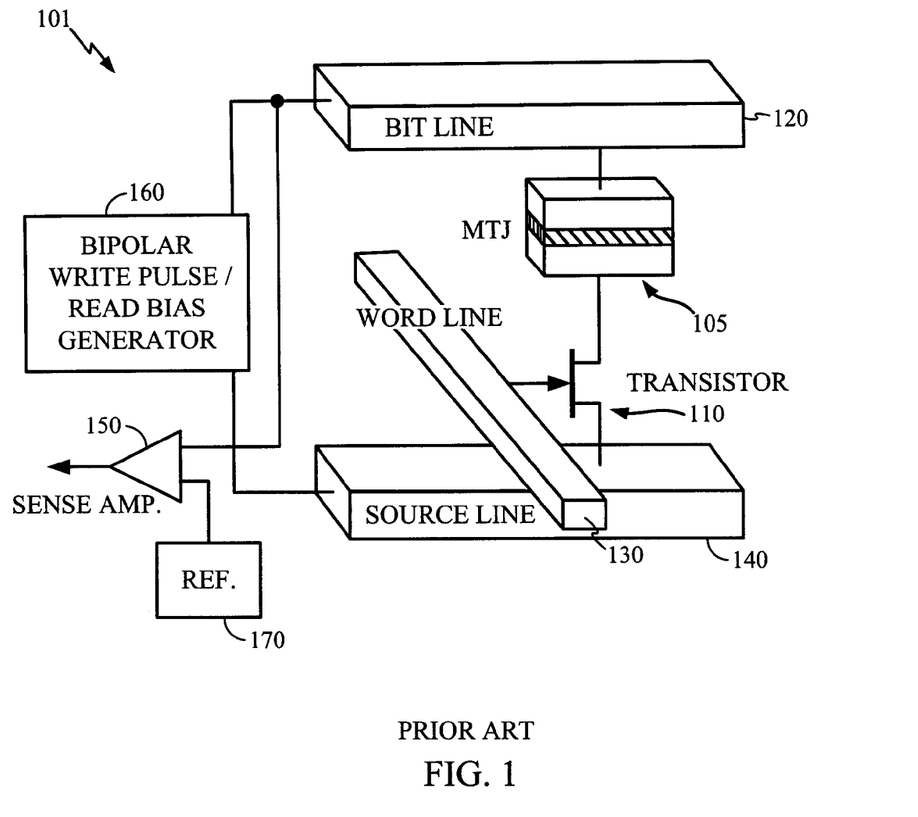
FIG. 1 is a block diagram of a conventional Spin Transfer Torque Magnetoresistive Random Access Memory (STT-MRAM) cell.

Referring to FIG. 1, a diagram of a STT-MRAM cell 101 is illustrated. The STT-MRAM cell 101 includes, for example, a MTJ 105, a transistor 110, a bit line 120, a word line 130, a source line 140, a sense amplifier 150, read/write circuitry 160, and a bit line reference 170. Those skilled in the art will appreciate the operation and construction of the memory cell 101 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

Figure 2A:
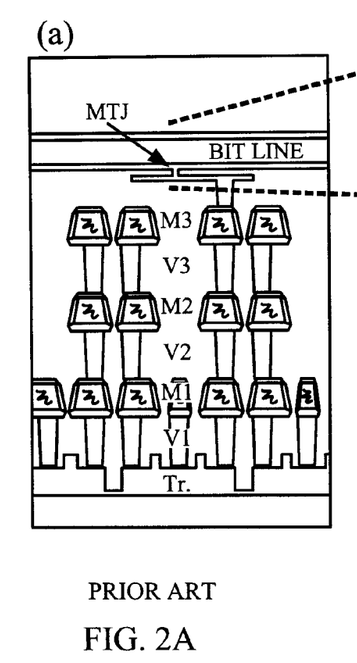
FIGS. 2A, 2B, and 2C are cross-sectional illustrations of a conventional STT MRAM cell.
Figure 2B:
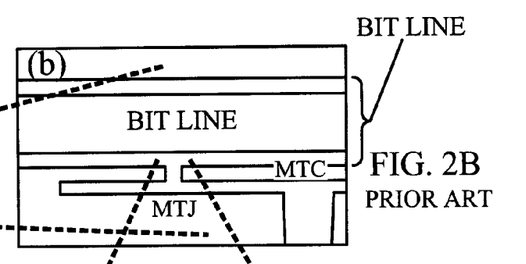
Figure 2C:
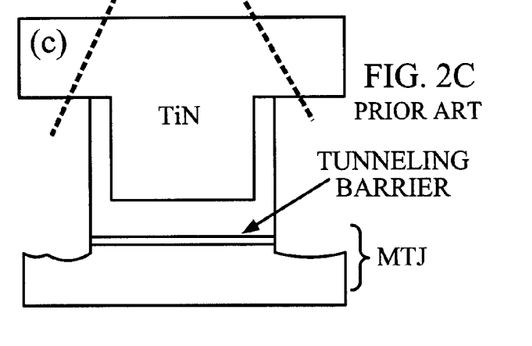

FIGS. 2A, 2B and 2C are cross-sectional illustrations of the conventional STT MRAM cell. The process in forming a conventional STT MRAM cell has several shortcomings. Initially, three additional masks are needed, to pattern the bottom electrode, the tunnel junctions and the top electrode. Additionally, it is difficult to control the etch stops on the bottom electrode of the conventional STT MRAM cell. The generally thin bottom electrode thus contributes to the line resistance and can limit the current flow through the cell. As the MTJ 130 is composed of multiple layers of very thin films (on the order of 50-100 nm), it is difficult to get an efficient etch process. Thus, it is necessary to terminate the etching at an exact interface. Accordingly, in a conventional process, high resolution lithographic tools are required in order to pattern down to sub 100 nm on highly reflective thin metal films.

Moreover, after patterning the films to form the MTJ (which in the example has a surface area of approximately 50×100 nm), there is generally poor adhesion between the MRAM cells and certain passivation materials. For example, after patterning the MTJ, it is necessary to deposit another insulator on top and to passivate the insulator layer. If the surface is not treated properly, it makes it difficult to control the interface between the MTJ and the electrode, thus this causes poor adhesion between the MTJ metal thin film layers and the dielectric (insulator). Thus, the interface is a weak point as the passivation layer is lost in subsequent processing. Further, with conventional lithographic technologies, different films require different chemical etchings and patterns. For example, there may be one set of chemical etchings and pattern conditions to remove one layer, while a completely different chemical etching and process needs to be used to remove a different layer of the MTJ to be formed as part of the memory cell.

SUMMARY

Exemplary embodiments of the invention are directed to a memory cell and a method for forming a magnetic tunnel junction of a memory cell.

Accordingly, an embodiment of the invention can include a memory comprising a substrate in a first plane; a first metal connection extending in a second plane, wherein the second plane is substantially perpendicular to the first plane; and a first magnetic tunnel junction (MTJ) having a first layer coupled to the metal connection such that the first layer of the MTJ is oriented along the second plane.

Another embodiment can include a method of forming a magnetic tunnel junction (MTJ) in a memory cell, the method comprising: providing a substrate in a first plane; forming a metal connection extending in a second plane, wherein the second plane is substantially perpendicular to the first plane; etching a trench in an oxide layer to expose at least a first portion of the metal connection, wherein the first portion of the metal connection is oriented along the second plane; depositing a plurality of layers of the MTJ in the trench such that the plurality of layers of the MTJ are oriented along the second plane and such that a first layer of the MTJ is coupled to the first portion of the metal connection.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Exemplary aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In general, the example embodiments are directed to a memory cell architecture and process of forming the magnetic tunnel junction (MTJ) portion of a Magnetoresistive Random Access Memory (MRAM) cell so as to reduce the overall fabrication cost and improve device reliability. Unlike the conventional spin torque transfer (STT) MRAM cells, only one, or alternatively two, photo masks need to be used instead of the three masks needed in the conventional process. In one example, the layers of the MTJ are deposited in a trench that is etched into an oxide layer so as to form a vertical junction of the MTJ in direct contact with the metal connection of the cell or device. Unlike using lithographic controls, which require extreme accuracy in 2-dimensions, one of the dimensions of the layers forming the MTJ can be controlled by the etch depth needed to create the trench for depositing the layers of the MTJ. Additionally, the dimensions (e.g., cell critical dimensions) of the layers forming the MTJ can be controlled by the weight of the metal layers deposited to form the MTJ. Accordingly, as will be seen in further detail below, an etching process may be utilized to form a cavity or a trench, and the physical deposition characteristics in forming the layers of the MTJ may be utilized in order to couple the MTJ to the metal connection.

The example memory cell and process of forming the memory cell inclusive of the MTJ is now described with reference to FIGS. 3-11. Example processes are described in the basic procedure of forming the MTJ for purposes of clarity and understanding.

Figure 3A:
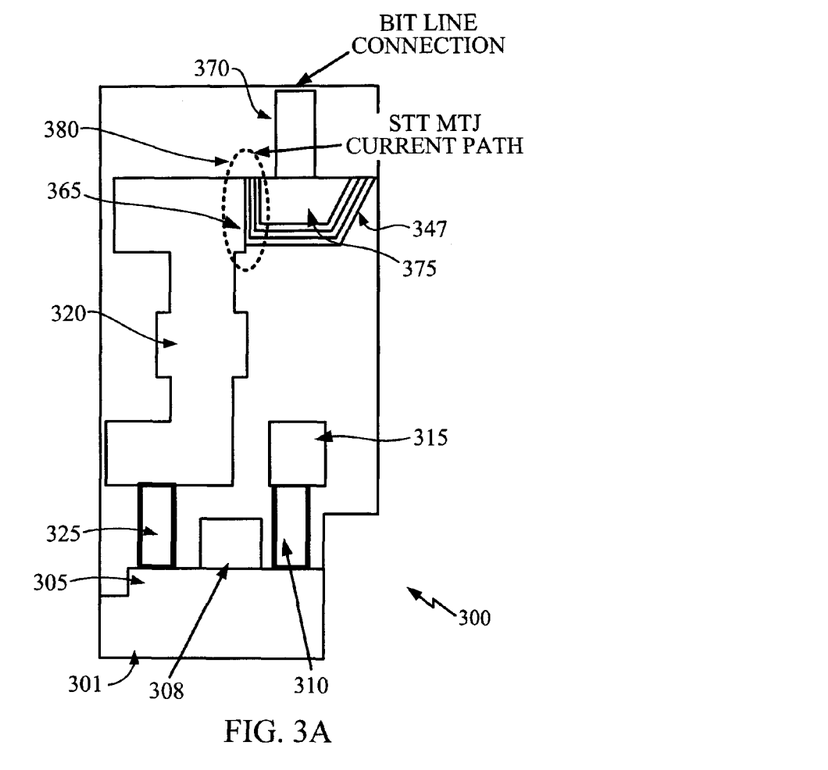
FIG. 3A illustrates a cross-sectional view of a magnetic tunnel junction (MTJ) and elements of a bit cell.

Referring to FIG. 3A, there is shown a cross-sectional view of a memory cell 300. The memory cell 300 includes a substrate 301 formed in a first plane and a metal connection 320 (e.g., copper, tungsten, etc.) extending in a second plane. The second plane is substantially perpendicular to the first plane. The memory cell 300 further includes a magnetic tunnel junction (MTJ) 365 having a first layer coupled to the metal connection 320 such that the first layer of the MTJ 365 is oriented along the second plane. As will be appreciated from the illustrated connection, the current flowing through the MTJ 365, passes through the interface indicated by 380. Details regarding the MTJ 365 will be further discussed in relation to FIG. 3B.

Figure 3B:
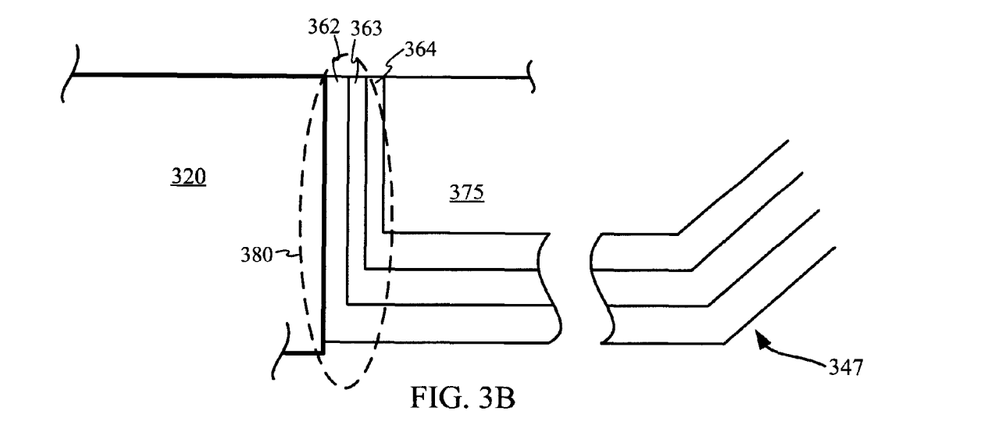
FIG. 3B illustrates a more detailed view of the MTJ coupled to the metal connection.

Referring to FIG. 3B, a more detailed illustration of the vertical arrangement of the MTJ 365 is illustrated. The MTJ 365 includes a plurality of layers, such as a fixed or pinned layer 362, a tunnel barrier layer 363, and a free layer 364. These layers can be formed from films or other methods as will be discussed in greater detail below. Further, it will be appreciated that each of these layers may contain one or more layers of materials to achieve the functionality of the layer, as discussed above. For example, one or more layers of material may be used to form pinned layer 362, however, the combination may be referred herein as a single functional layer for convenience.

As can be seen from the detailed arrangement of FIG. 3B, each of the functional layer (362-364) of the MTJ are oriented along a sidewall of connector 320 in a vertical plane (in relation to the substrate). Although the layers (362-364) of the MTJ 365 also extend horizontal, the current flow through the MTJ 365 is substantially between electrode 375 and connector 320 as highlighted by current path 380. The additional thickness of the horizontal portions of layers 362-364, particularly of tunnel barrier layer 363, aid in directing current flow through vertical interface as highlighted by current path 380. Additionally, the sloped portion 347 of the MTJ layers 362-364 also maintain the increased layer thickness which inhibits leakage through these portions and concentrates the current flow through 380. It will be appreciated that the sloped profile aids in establishing the increased layer thickness in the sloped portion 347 of the layers.

Referring back to FIG. 3A, the MTJ 365 is coupled to a bit line (not shown) by the conductor 370 and electrode 375. The metal connection 320 and conductor 325 couple the MTJ 365 to transistor 305. Transistor 305 is coupled to a word line connection 308 and source line connection via conductors 310 and 315. The configuration of the memory cell 300 is illustrated in relation to a schematic diagram in FIG. 4.

Figure 4:
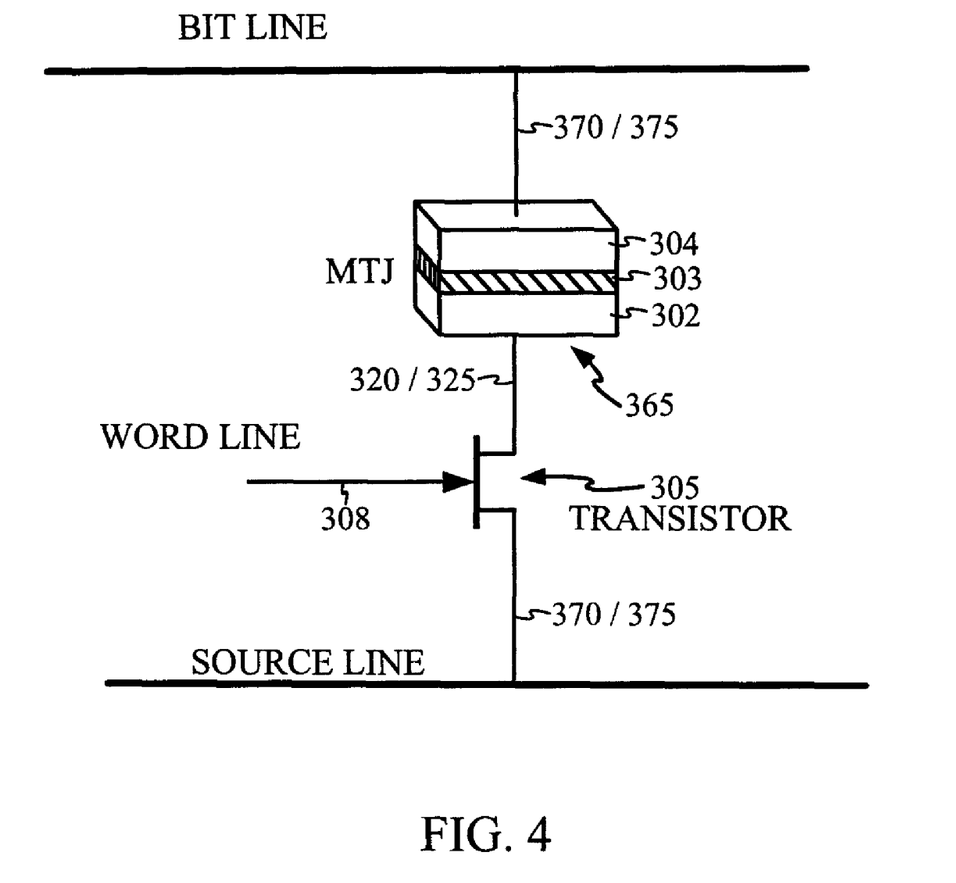
FIG. 4 illustrates a schematic of a bit cell showing the relationship to the elements of FIG. 3A.

FIG. 4 illustrates a schematic diagram of the memory cell 300 and the relationship to the elements depicted in relation to FIGS. 3A and 3B. To facilitate an understanding of this relationship, the reference numbers for like elements have been maintained. It should be noted that for convenience of illustration that the physical orientation of several of the elements, e.g., MTJ 365, transistor 305, etc. are not maintained in the schematic diagram. The bit line is couple to the MTJ 365 via elements 370 and 375. The MTJ 365 is couple to the access/word line transistor 305 via elements 320 and 325. The word line is coupled to transistor 305 via element 308 and the source line is coupled to transistor 305 via elements 315 and 310. The remaining functional aspects of the memory array (e.g., sense amplifier, etc.) are not detailed, but are illustrated in FIG. 1, for example, and are known in the art.

Referring to FIGS. 5-11, an exemplary method of fabricating a magnetic tunnel junction (MTJ) 365 in a memory cell 300 according to embodiments of the invention will now be described. In FIGS. 5-11, the reference numbers for related elements have been maintained. Likewise, to avoid redundancy, not all elements will be discussed in the description of each figure.

Figure 5:
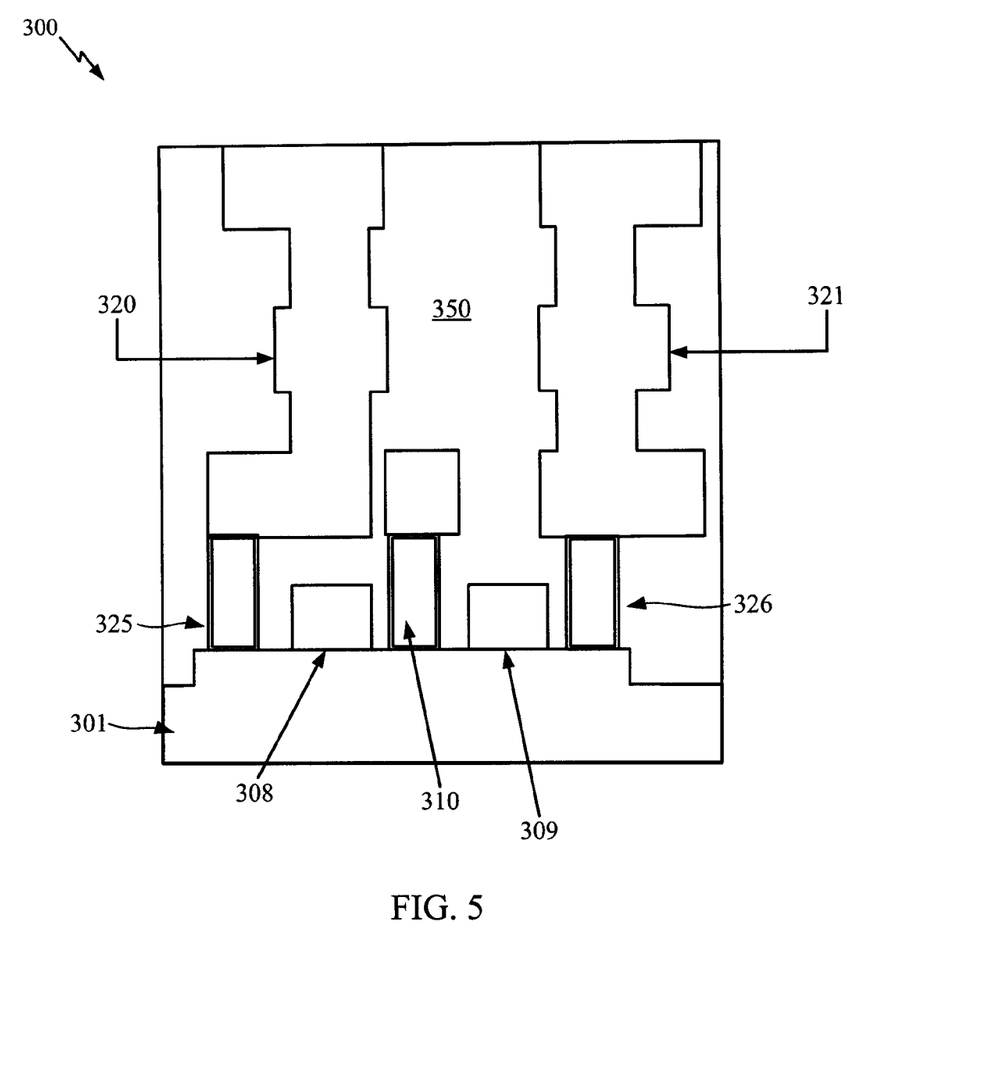
FIG. 5 illustrates a cross-sectional view of a partially fabricated memory cell.

As illustrated in FIG. 5, an embodiment of the invention can include two memory cells having a shared source line connection 310. The additional elements of the second cell such as word line connection 309, conductive elements 326 and 321 serve similar purposes and accordingly will not be discussed in detail. As discussed above, the substrate 301 can be formed in a first plane and a metal connection 320 can be formed to extend in a second plane that is substantially perpendicular (e.g., vertical) to the first plane. The metal connection 320 is enveloped in a non-conducting layer 350 (e.g., an oxide layer). The metal connection 320 and other conductive elements can be made of a suitable metal material having good electrical conductive properties such as copper, tungsten, aluminum, and the like, as is known in the art.

Figure 6:
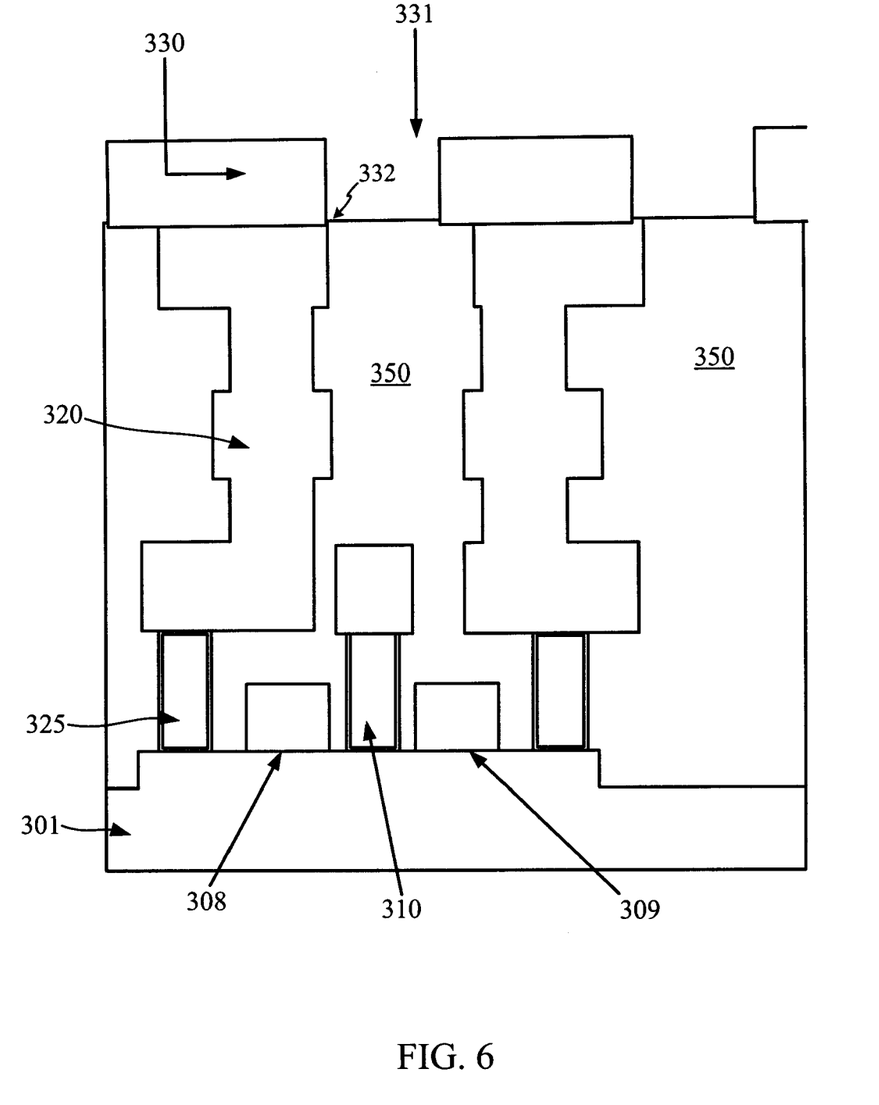
FIG. 6 illustrates a cross-sectional view of a partially fabricated memory cell.
Figure 7:
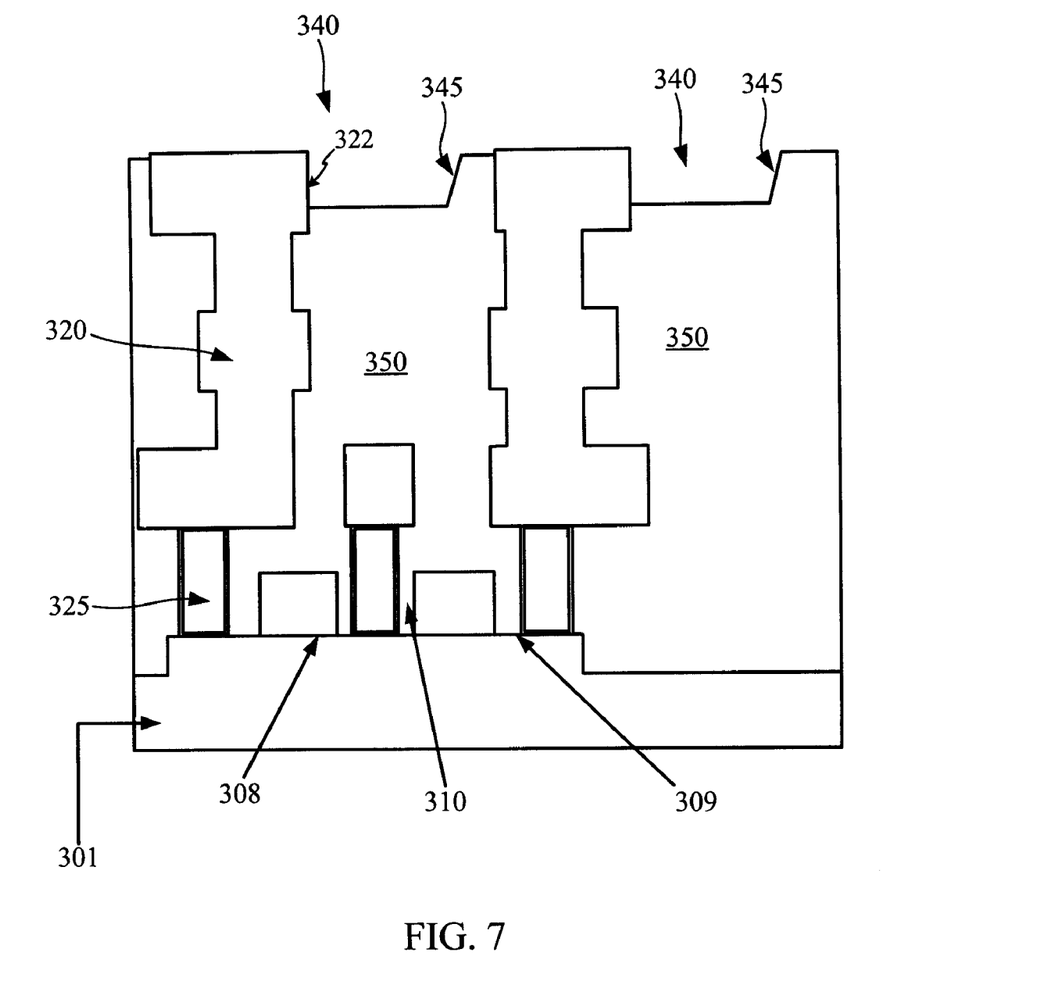
FIG. 7 illustrates a cross-sectional view of a partially fabricated memory cell.

Referring to FIGS. 6 and 7, once the partial cell structure 300 has been provided, a trench 340 can be etched in the oxide layer 350 to expose at least a first portion of the metal connection 320, wherein the first portion of the metal connection 320 is oriented along the second plane.

As illustrated in FIG. 6, a photoresist layer 330 having a pattern of openings 331 may be provided on a top surface of the cells. The openings 331 can be positioned such that they overlay a portion 332 of metal connection 320 to ensure that the first portion of the metal connection 320 will be exposed. A chemical etchant may then be used to etch a trench or cavity 340 in portions of the oxide layer 350 exposed by the pattern of openings 331, as shown in FIG. 7. During this first etching step, the pattern and/or exposed portion of the metal connection 320 can be controlled in a number of ways. For example, process variables such as time the etchant is applied and/or chemistry of the etchant can be controlled. Additionally, different patterns can be used to etch the trench 340 in the portion of the oxide layer 350 that envelops the metal connection 320.

Referring again to FIGS. 6 and 7, the oxide layer 350 can be etched to a desired depth to expose at least a first portion 322 of the metal connection 320 that is oriented along the second plane. Further, the trench or cavity 340 may be formed such that one side of the trench 340 is sloped as evident by portion 345. This sloped portion 345 of the oxide layer 350, or "slope profile," can be controlled as a function of any one or more of the etchant process variables as is known in the art. In other embodiments, the parameters may be manipulated to achieve a thinner metal connection 320 in comparison to the formed cavities 340, or a pattern where the metal connection 320 is thicker or wider in comparison to the formed trench 340 in which the layers of the MTJ are be deposited. Further, the sloped portion 345 facilitates maintaining thicker layers in the sloped portion 345 of the MTJ as opposed to the vertical portion 322, as discussed above in relation to FIG. 3B.

Figure 8:
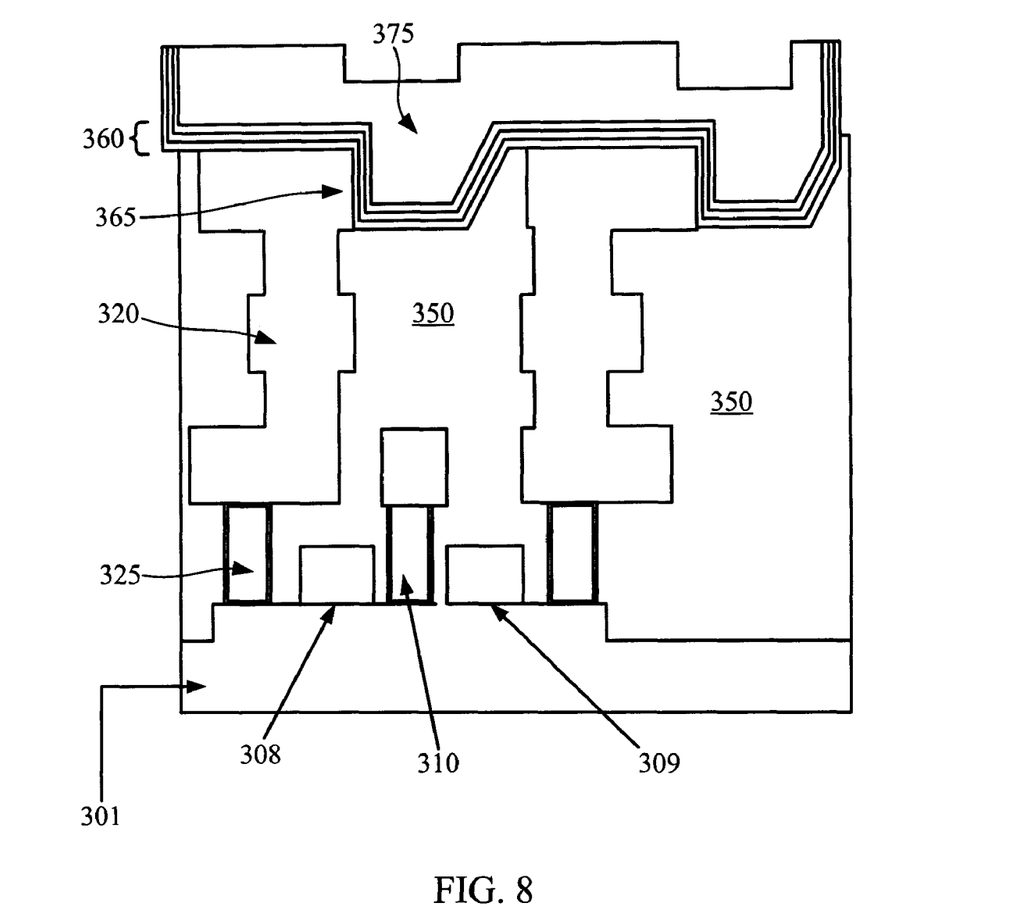
FIG. 8 illustrates a cross-sectional view of a partially fabricated memory cell.

Next, as shown in FIG. 8, thin film layers 360 (e.g., 362-364) of the MTJ 365 can be deposited in the trench 340 such that a portion of the first layer (e.g., 362) of the MTJ 365 is oriented along the second plane and such that the first layer of the MTJ 365 is coupled to the first portion 322 of the metal connection 320. The thin film layers 360 which are to form the MTJ 365 may be deposited on top of the cells and within the trench 340. These thin film layers 360 may be embodied as thin ferromagnetic films including, for example, a pinned layer 362 (e.g., Ta/PtMn/CoFe/Ru/CoFeB), a tunnel barrier layer 363 (e.g., AlOx or MgO), and a free layer 364 (e.g., CoFeB/Ta). One or more layers of the MTJ 365 may be thinner along the first portion of the metal connection 320 (i.e., the exposed sidewall 322 of the metal connection 320) than along the portions of the trench 340 which are parallel to the substrate 301 or sloped with respect to the substrate 301. After deposition of each of the thin film layers 360, which are to form the MTJ 365, a metal layer 375 may be formed over the thin film layers 360.

Figure 9:
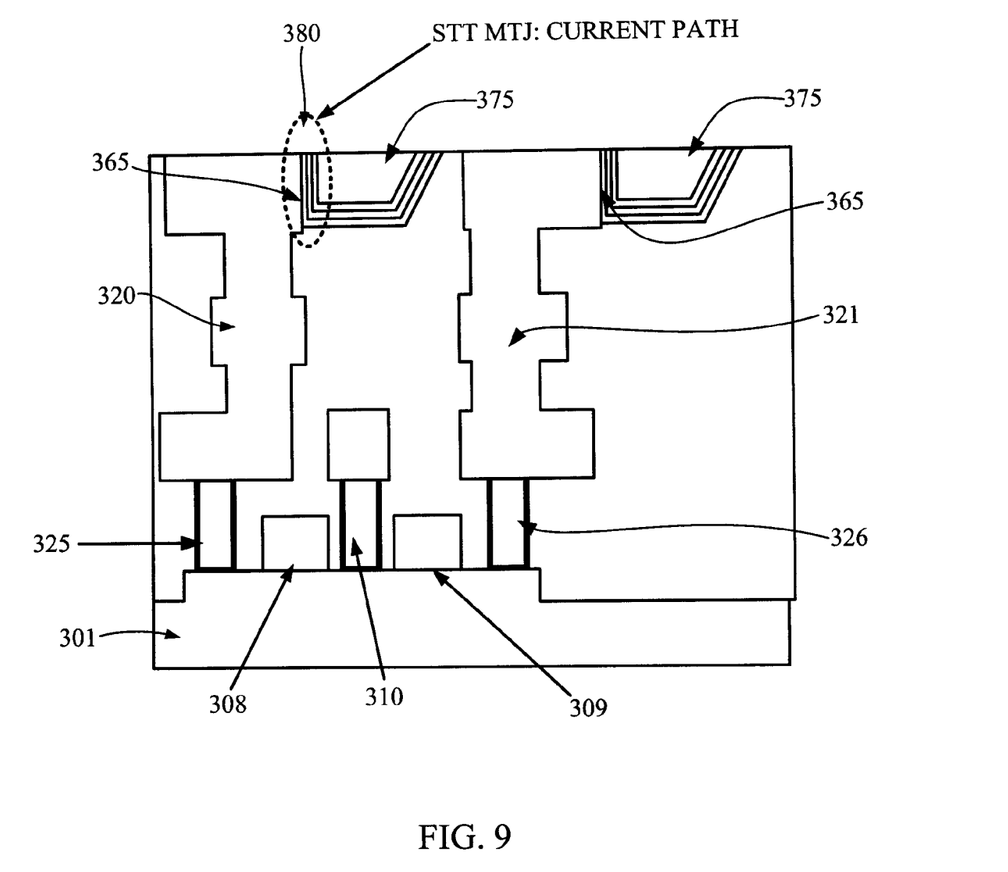
FIG. 9 illustrates a cross-sectional view of a partially fabricated memory cell.

Referring to FIG. 9, the extraneous thin film layers 360 of the MTJ 365 and the metal layer 375 can be removed by polishing, such as chemical mechanical polishing (CMP), etching (e.g., plasma etching), or other known techniques. As shown in FIG. 9, the thin film layers 360 and the metal layer 375 are polished or etched to substantially correspond to the upper surface of metal connection 320. The upper surface of metal connection 320 can be parallel to the plane of the substrate 301. By removing the thin film layers 360 and metal layer 375 overlaying the top surface, the remaining layers form the MTJ 365 and electrode 375 and fill in trench 340.

Figure 10:
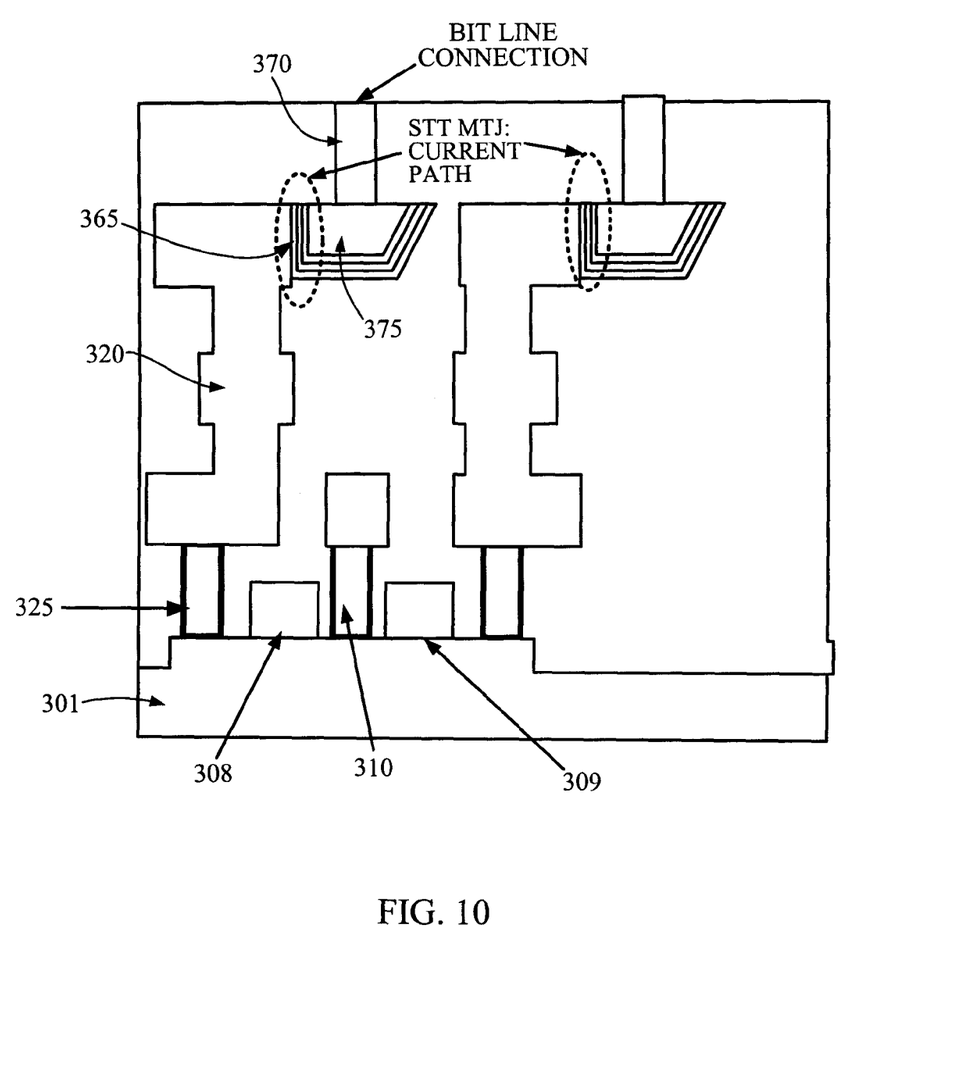
FIG. 10 illustrates a cross-sectional view of a fabricated memory cell.

Referring to FIG. 10, a bit line connection 370 can be formed by a conductive element (e.g., a via) on the electrode 375 to electrically couple the electrode 375, and hence the MTJ 365, to a bit line (not shown). The conductive element 370 can be embedded in a non-conducting layer, which may also overlaid on top of the electrical connector 320.

Figure 11:
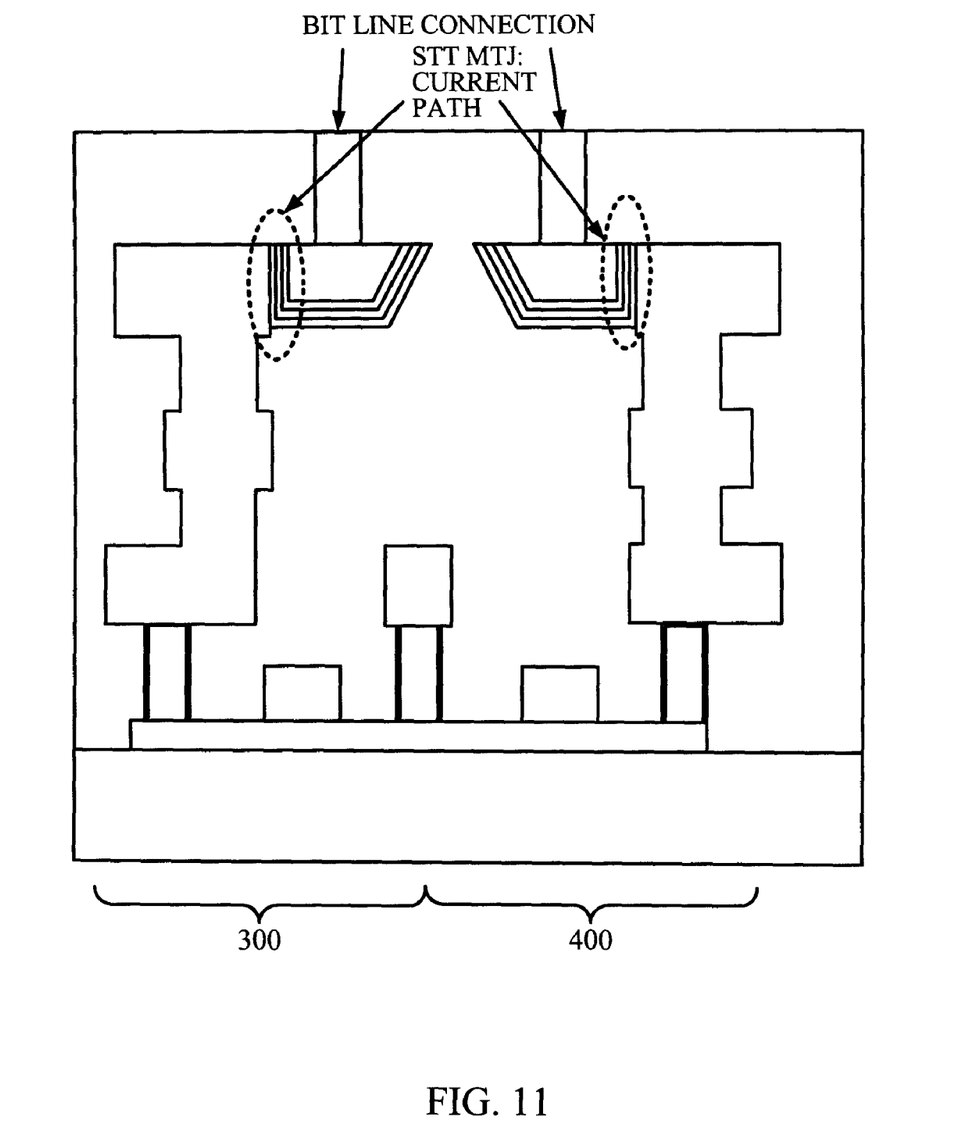
FIG. 11 illustrates a cross-sectional view of another embodiment of a memory cell.

Referring to FIG. 11, an exemplary arrangement of magnetic tunnel junctions (MTJs) in a memory array according to another embodiment of the invention will now be described. As shown in FIG. 11, a pair of bit cells 300 and 400 can be formed as mirror images of each other. For example, trenches can be etched in the oxide layer to expose adjacent first portions of each of the plurality of metal connections which are in the second plane. The MTJ layers can be deposited in the trenches formed in the area between adjacent pairs of metal connections. It will be appreciated that the process of forming the cells 300 and 400 according to FIG. 11 are similar to the processes illustrated in FIGS. 5-10, and therefore, a detailed explanation is not provided herein. Further, it will be appreciated that the process for the dual bit cells can be applied to individual bit cells, such as illustrated in FIG. 3A or may be applied to more than two bit cells at a time. Accordingly, embodiments of the invention are not limited to the illustrated examples provided herein.

The overall dimensions (e.g., width and/or length) of the junction area of the MTJ 365, can be adjusted depending on the desired application of the memory cell 300. In other words, the desired pattern can be formed depending on the specifics of the particular memory cell 300. In any case, the dimensions of the MTJ 365, and hence the memory cell 300, may be a function of the depth of the trench 340 that is etched into the oxide layer 350 of the memory cell 300 in order to form the MTJ 365, as well as the thickness of the thin film layers 360 to be applied in forming the MTJ 365 during the above-described deposition process.

As set forth above, due in part to the physical deposition nature of this process, the tunnel barrier thickness in the MTJ 365 may be thinnest near the exposed first portion 322 of the metal connection 320 (e.g., as shown in FIG. 7) and thicker elsewhere in the trench 340. Accordingly, the tunnel current may primarily pass between the metal connection 320 (such as a copper or tungsten) and the electrode 375 through the vertical portion of the MTJ 365 adjacent 322.

Accordingly, and unlike conventional processing techniques, only one or two photo masks may be used in order to form the STT MRAM cell 300 architecture, as exemplarily shown in FIGS. 3-10. In the previous examples, a first etching process is used to form the trench or cavity 340, and then after the thin film layers 360 of the MTJ 365 and metal layer 375 are deposited, a second etching process, or alternatively a polishing step, is performed to form the MTJ 365 and electrode 375. Moreover, the MTJ 365 is formed in a vertical orientation (i.e., oriented in a second plane that is perpendicular to the substrate) and its size can be controlled by the hole dimensions of the photo mask, the etch depth of the trench 340 and/or the weight of the thin film layers 360, rather than by use of more or tightly toleranced lithographic controls. The manufacturing processes used herein may be compatible to a damascene process (single or double) to reduce manufacturing costs. The vertical orientation may provide improved electrical conduction between the bit line 140 (as shown in FIG. 1) and the STT MRAM cells 300 and may provide improved or better adhesion between the MTJ 365 and the metal connection 320, providing a metal-to-metal contact instead of an insulation to metal contact as in the conventional STT MRAM cell structure.

While the foregoing disclosure shows illustrative embodiments of the invention, it should be noted that various changes and modifications could be made herein without departing from the scope of embodiments of the invention as defined by the appended claims. For example, the functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A memory comprising:
a substrate in a first plane;
a first metal connection extending in a second plane, wherein the second plane is substantially perpendicular to the first plane;
a first magnetic tunnel junction (MTJ) having a first layer, a second layer and a third layer, the first layer being coupled to the first metal connection, such that the first layer of the MTJ is oriented along the second plane, wherein the second and third layers are also oriented along the second plane; and
a first metal via extending in a second plane offset from the first metal connection and coupled to the third layer of the first MTJ and configured to direct current flow in a direction oriented along the first plane, between the first connection and first via through the first, second and third layers of the first MTJ.

2. The memory of claim 1, wherein a transistor is formed on the substrate.

3. The memory of claim 2, wherein the first metal connection is coupled to the transistor.

4. The memory of claim 3, further comprising:
a source line connection and a word line connection, wherein each are coupled to the transistor.

5. The memory of claim 4, further comprising:
a bit line connection coupled to the first metal via of the first MTJ.

6. The memory of claim 5, wherein the current is configured to flow between the bit line connection and the metal connection through the layers of the first MTJ in the second plane.

7. The memory of claim 1, wherein the first layer is a pinned layer, the second layer is a tunnel barrier layer and the third layer is a free layer.

8. The memory of claim 7, further comprising:
a trench formed in an insulator, wherein the pinned, tunnel barrier, and free layers of the first MTJ are formed in the trench,
wherein the trench has a bottom portion parallel to the first plane and a sloped portion sloped with respect to the second plane, and
wherein at least the tunnel barrier layer is thicker in the bottom portion and sloped portion than a portion oriented along the second plane.

9. The memory of claim 1, further comprising:
a second metal connection extending in the second plane; and
a second magnetic tunnel junction (MTJ) having a first layer coupled to the second metal connection such that the first layer of the second MTJ is oriented along the second plane.

10. The memory of claim 9, wherein one source line is shared for each pair of the MTJs.

11. The memory of claim 10, further comprising:
a first word line for the first MTJ; and
a second word line for the second MTJ.

12. The memory of claim 11, wherein the first word line is positioned between the first metal connection and a source line connection, and wherein the second word line is positioned between the second metal connection and the source line connection.

13. The memory of claim 9, wherein the first MTJ is located on a first side of the first metal connection and wherein the second MTJ is located on a side of the second metal connection that is adjacent the first side of the first metal connection.

14. The memory of claim 1, wherein the memory is a Spin Transfer Torque Magnetoresistive Random Access Memory (STT-MRAM).

15. A memory comprising:
a substrate in a horizontal plane;
a first means for conducting extending vertically from the horizontal plane in a vertical plane that is substantially perpendicular to the horizontal plane;
a first storage means having a first layer, a second layer and a third layer, the first layer being disposed on a vertical surface of the first means for conducting at a vertical interface, wherein the first storage means is a magnetic tunnel junction (MTJ); and a second means for conducting extending vertically, offset from the first conducting means, and coupled to the third layer of the first storage means that is disposed in the vertical plane, and wherein the first, second and third layers and first and second means for conducting are configured to direct current flow in a direction oriented along the horizontal plane through the first, second and third layers of the first storage means.

16. The memory of claim 15, wherein a means for controlling electrical current is formed on the substrate.

17. The memory of claim 16, further comprising:
a source line connection and a word line connection, wherein each are coupled to the means for controlling electrical current and wherein the first means for conducting is coupled to the means for controlling electrical current.

18. The memory of claim 15, wherein the first layer is a pinned layer the second layer is a tunnel barrier layer and the third layer is a free layer.

19. The memory of claim 18, further comprising:
a trench formed in an insulator, wherein the pinned, tunnel barrier, and free layers of the first storage means are formed in the trench, wherein the trench has a bottom portion parallel to the horizontal plane and a sloped portion sloped with respect to the horizontal plane, and wherein at least the tunnel barrier layer is thicker in the bottom portion and sloped portion than a portion vertically disposed in the vertical plane.

20. The memory of claim 1, further comprising:
a third means for conducting extending in the vertical plane; and
a second storage means having a first layer coupled to the third means for conducting such that the first layer of the second storage means is disposed on vertical surface of the third conducting means.

21. The memory of claim 20, further comprising:
a first word line for the first storage means; and
a second word line for the second storage means, wherein one source line is shared for each pair of the storage means.

22. The memory of claim 15, wherein the memory is a Spin Transfer Torque Magnetoresistive Random Access Memory (STT-MRAM).

* * * * *